United States Patent
Lin et al.

(10) Patent No.: US 11,430,671 B2
(45) Date of Patent: Aug. 30, 2022

(54) OZONE WAFER CLEANING MODULE HAVING AN ULTRAVIOLET LAMP MODULE WITH ROTATABLE REFLECTORS

(71) Applicant: TAIWAN SEMICONDUCTOR MANUFACTURING CO., LTD., Hsinchu (TW)

(72) Inventors: Chen-Yang Lin, Hsinchu County (TW); Chung-Hsuan Liu, Taichung (TW); Ku-Hsiang Sung, Taoyuan (TW); Kuan-Wen Lin, Taichung (TW); Chia-Jen Chen, Hsinchu County (TW); Hsin-Chang Lee, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/944,026

(22) Filed: Jul. 30, 2020

(65) Prior Publication Data
US 2022/0037171 A1    Feb. 3, 2022

(51) Int. Cl.
| | |
|---|---|
| *H01L 21/67* | (2006.01) |
| *B08B 7/00* | (2006.01) |
| *B08B 5/00* | (2006.01) |
| *B08B 7/04* | (2006.01) |
| *B08B 13/00* | (2006.01) |
| *H01L 21/02* | (2006.01) |

(52) U.S. Cl.
CPC ......... *H01L 21/67028* (2013.01); *B08B 5/00* (2013.01); *B08B 7/0057* (2013.01); *B08B 7/04* (2013.01); *B08B 13/00* (2013.01); *H01L 21/02057* (2013.01)

(58) Field of Classification Search
CPC ......... H01L 21/67028; H01L 21/02057; H01L 21/67115; H01L 21/67017; B08B 5/00; B08B 13/00; B08B 7/04; B08B 7/0057
See application file for complete search history.

(56) References Cited

U.S. PATENT DOCUMENTS

| | | | | |
|---|---|---|---|---|
| 2,838,705 A | * | 6/1958 | Hierholzer, Jr. | H01J 61/42 313/25 |
| 3,829,982 A | * | 8/1974 | Pray | F26B 3/28 392/417 |
| 6,599,618 B1 | * | 7/2003 | Simmon, Jr. | B08B 7/0035 428/212 |
| 6,717,158 B1 | * | 4/2004 | Gat | F27D 19/00 250/492.2 |

(Continued)

FOREIGN PATENT DOCUMENTS

| | | | | |
|---|---|---|---|---|
| JP | 04192526 A | * | 7/1992 | ......... C23C 14/0036 |
| JP | 2013208538 A | * | 10/2013 | |

*Primary Examiner* — Alexander Markoff
(74) *Attorney, Agent, or Firm* — Maschoff Brennan

(57) ABSTRACT

A wafer cleaning module and a method for cleaning a wafer with the wafer cleaning module are disclosed. For example, the wafer cleaning module includes a wafer chuck to hold a wafer, an ozone source to provide ozone gas towards the wafer, and an ultraviolet (UV) lamp module to provide UV light. The UV lamp module includes a UV light source and a rotatable reflector around the UV light source. The rotatable reflector is movable to adjust an amount of UV light directed towards a surface of the wafer.

20 Claims, 4 Drawing Sheets

(56) References Cited

U.S. PATENT DOCUMENTS

| | | | | |
|---|---|---|---|---|
| 6,896,937 B2* | 5/2005 | Woudenberg | ........ | C09D 11/101 |
| | | | | 347/100 |
| 2007/0257205 A1* | 11/2007 | Rocha-Alvarez | ...... | B05D 3/067 |
| | | | | 250/492.1 |
| 2008/0067425 A1* | 3/2008 | Kaszuba | ................ | G21K 1/062 |
| | | | | 250/492.2 |
| 2010/0285240 A1* | 11/2010 | Rocha-Alvarez | ........................... | |
| | | | | H01L 21/67115 |
| | | | | 427/595 |
| 2012/0003398 A1* | 1/2012 | Kaszuba | ................... | F26B 3/28 |
| | | | | 427/595 |
| 2012/0129275 A1* | 5/2012 | Yang | ................... | H05B 41/3922 |
| | | | | 438/5 |
| 2015/0357183 A1* | 12/2015 | Ren | ...................... | H01J 37/321 |
| | | | | 438/703 |

* cited by examiner

OZONE WAFER CLEANING MODULE HAVING AN ULTRAVIOLET LAMP MODULE WITH ROTATABLE REFLECTORS

BACKGROUND

The semiconductor integrated circuit (IC) industry has experienced exponential growth. Advances in IC materials and design have produced faster and smaller circuits. The circuits have become more complex with more interconnected devices within a smaller area of the IC.

Processing of substrates to form the IC may include several different manufacturing steps. Between certain manufacturing steps, the substrates may be cleaned to remove contaminants or residue before the substrate may continue to the next manufacturing step of the IC manufacturing process. Contaminants may cause defects in the IC during processing. As a result, the cleaning steps may remove undesirable contaminants, debris, and the like from a surface of the substrate or layers on the substrate to prevent defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
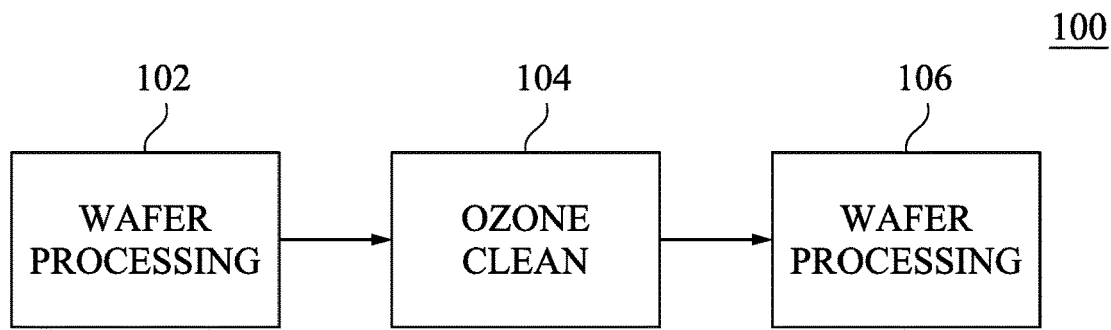
FIG. 1 illustrates a functional block diagram of wafer processing according to at least one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is related to various embodiments of an ozone wafer cleaning module having an ultraviolet (UV) lamp module with a rotatable reflector and methods for processing a substrate with the ozone cleaning module. As noted above, substrates or wafers may be processed through various manufacturing steps during manufacture of an integrated circuit (IC) device. Between certain steps, the substrate, or top layer of the substrate that is to be processed at a particular manufacturing step, may be cleaned to remove debris and contaminants. Removing the debris and contaminants may prevent defects from forming in the substrate, which may cause the IC device to fail.

However, currently available wafer cleaning modules that use UV lamp modules and ozone gas have reflectors that are in a fixed position. In some instances, the reflectors are fixed such that the UV light is emitted away from the wafer. Thus, the UV light can be used to transform the ozone gas into hydroxide (OH) radicals, but the surface modification efficiency may be low.

In other instances, the reflectors may be fixed such that the UV light is emitted directly onto the surface of the wafer. However, this direct UV light exposure may cause defects in certain materials or metals. For example, the UV light exposure can lead to film cracks due to over oxidation.

Thus, for different types of materials or different layers on the wafer, different tools may be deployed during manufacturing of the IC device. This may be expensive and inefficient. Moreover, multiple different tools may take up more floor space and area in the fabrication plant, thereby further adding to costs.

In contrast, the wafer cleaning module of the present disclosure may include rotatable reflectors. The rotatable reflectors may be rotated around a UV light source to direct the UV light towards a desired target. For example, the rotatable reflectors may be moved or rotated to direct UV light away from the surface of the wafer, towards the surface of the wafer, or any position in between.

In some embodiments, multiple UV light sources with respective rotatable reflectors may be deployed. The rotatable reflectors for each UV light source may be rotated into various positions to control the amount of UV light that is directed towards or away from the top surface of the wafer.

Thus, a single wafer cleaning module can be used to clean wafers with various different materials or metals. For example, the rotatable reflectors may be positioned to provide the correct amount of UV light on the top surface of the wafer for different materials that can be processed ranging from a light surface modification, a medium surface modification, and a strong surface modification.

FIG. 1 illustrates a block diagram of an example process flow 100 for manufacturing an IC device. The process flow 100 may illustrate a small portion of the overall IC device manufacturing process. The process flow 100 may represent more than one portion of the overall process flow 100 for manufacturing an IC device.

In one embodiment, the process flow 100 may include a first wafer processing 102, an ozone clean 104, and a second wafer processing 106. In one embodiment, the first wafer processing 102 and the second wafer processing 106 may include a variety of different types of processes. For example, the first wafer processing 102 may include a deposition process. The deposition process may include deposition of a metal or any type of material onto a wafer or layer of the wafer. For example, the deposition processes may include a chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The deposited material may be cleaned before being processed in the second wafer processing 106. For example, the second wafer processing 106 may be another deposition process to deposit another layer of material.

In another embodiment, the first wafer processing 102 may be an etching step. For example, portions of a layer on the wafer may be etched via a wet etch, a dry etch, or any combinations thereof. The wafer may then be cleaned in the ozone clean 104. The second wafer processing 106 may be deposition of another layer on the etched portions of the wafer.

In one embodiment, the first wafer processing 102 may be a metal deposition. For example, a layer of metal may be deposited onto the wafer. The metal may be Ruthenium (Ru), Molybdenum (Mb), Chromium (Cr), and the like. The second wafer processing 106 may be a lithography operation. For example, a layer of resist may be spun onto the layer of metal that is deposited in the first wafer processing 102, patterned, and developed. For example, the lithography operation may be performed by a lithography system or an extreme ultraviolet (EUV) lithography system that uses an EUV radiation source. The metal may be cleaned via the ozone clean 104 before the lithography operation is performed.

In one embodiment, the ozone clean 104 may be performed by an ozone based wafer cleaning module. The wafer cleaning module may dispense ozone gas ($O_3$) that can be decomposed with UV light to form oxygen radicals (O·). Deionized (DI) water ($H_2O$) may be provided to react with the oxygen radicals to form hydroxide radicals (OH·). The hydroxide radicals may oxidize the surface of the metal layer that is deposited in the first wafer processing 102 to modify the surface to be more hydrophilic. By modifying the surface of the metal to be more hydrophilic, the cleaning performance of the top surface of the wafer can be improved.

In one embodiment, the UV light may be provided at a wavelength of approximately 200-300 nanometers (nm). In one example, the UV light may be provided at approximately 254 nm to decompose the ozone gas. In one embodiment, the decomposition of the ozone gas into hydroxide radicals may follow equations (1) and (2) below:

  (1)

  (2)

As noted above, certain metals may form defects when exposed to UV energy along with oxidation by the hydroxide radicals. The UV energy and the oxidation may result in over-oxidation and formation of defects in certain materials. For example, when the metal is Ru, the Ru layer or film may form cracks when exposed to UV energy along with the oxidation by the hydroxide radicals.

However, with other materials, the treatment time for cleaning may be reduced by providing greater surface modification. For example, on some materials such as Cr, the greater the contact angle (e.g., an angle at which UV light rays contact the top surface of wafer) the lower the treatment time. In other words, the greater the contact angle, the more UV light is directed towards the top surface of the wafer and the more hydrophilic the surface becomes. The more hydrophilic the surface becomes, the easier the surface is to clean.

Figure 2:
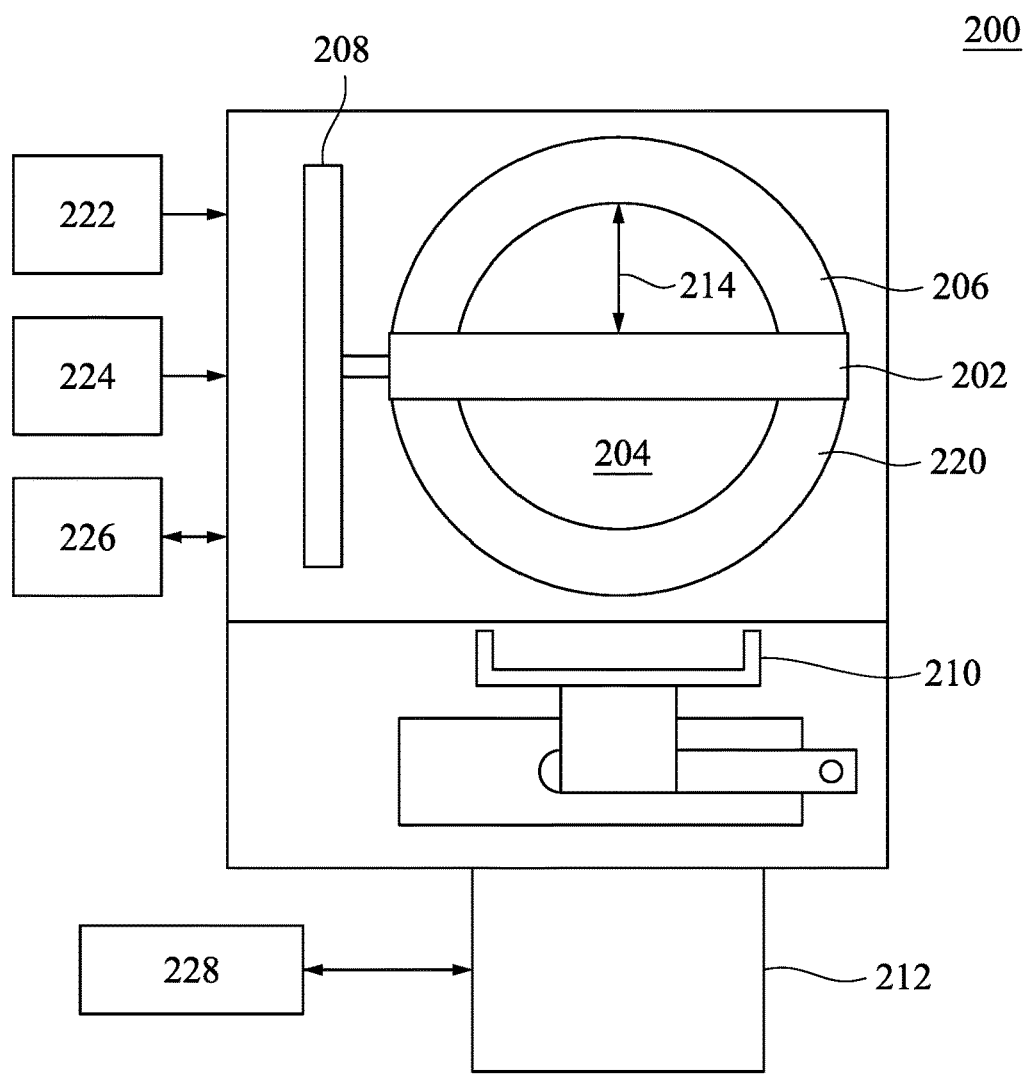
FIG. 2 illustrates a block diagram of an ozone wafer cleaning module according to at least one embodiment of the present disclosure.

The present disclosure provides a wafer cleaning module that uses rotatable reflectors on the UV lamp module to control an amount of UV light that is directed towards the surface of the wafer, or layers on the wafer. Thus, wafers having a film stack of Ru and Cr, as well as other types of materials, can be processed in the same wafer cleaning module of the present disclosure. The positioning of the rotatable reflectors can be controlled to control the amount of UV light directed towards the wafer based on the type of material in the film stack on top of the wafer that is to be cleaned. FIG. 2 illustrates a block diagram of an example wafer cleaning module 200 of the present disclosure.

In one embodiment, the wafer cleaning module 200 may include a load port 212. The load port 212 may receive a cassette of wafers to be cleaned in the wafer cleaning module 200. The wafer cleaning module 200 may include a transfer arm 210. The transfer arm 210 may be a robotic arm that transfers wafers from the load port 212 into a wet chamber 220 of the wafer cleaning module 200.

In one embodiment, the wafer cleaning module 200 may include a chuck 206 that is used to support or hold a wafer 204. In one embodiment, the wafer cleaning module 200 may include a UV lamp module 202 with rotatable reflectors. The UV lamp module 202 may be coupled to a movable arm 208. The movable arm 208 may move the UV lamp module 202 laterally over the wafer 204 as shown by an arrow 214.

In one embodiment, the wafer cleaning module 200 may include additional components. For example, the wafer cleaning module 200 may include an ozone source 222 to supply ozone gas, a DI water source 224 to provide DI water, quartz plates (illustrated in FIG. 4A, and discussed below) to provide a uniform curtain of the ozone gas across the wafer, and the like.

In one embodiment, the wafer cleaning module 200 may include a user interface 228 and a controller 226. For example, a technician may enter information that identifies a type of material that is deposited on a top layer or surface of the wafer 204 vis the user interface 228. The controller 226 may then control the amount of rotation of the rotatable reflectors to position the rotatable reflectors to provide a correct amount of UV light for the type of material on a top layer of the wafer 204.

Figure 4A:
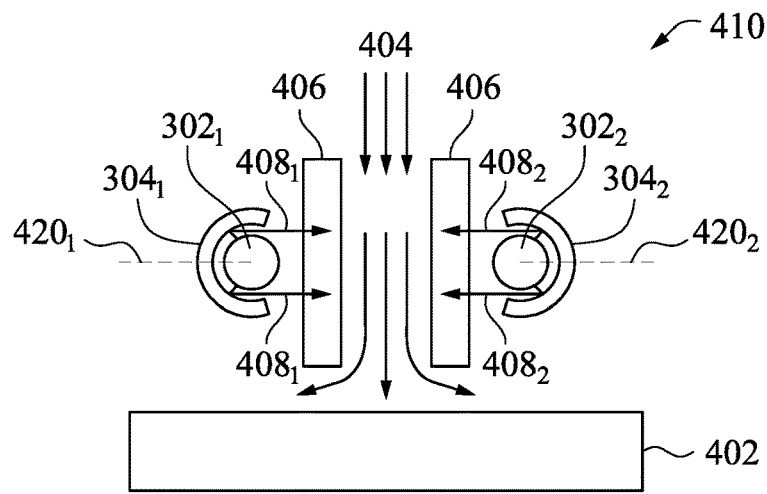
FIG. 4A-4C illustrates various modes of the UV lamp module with the rotatable reflector according to at least one embodiment of the present disclosure.
Figure 4B:
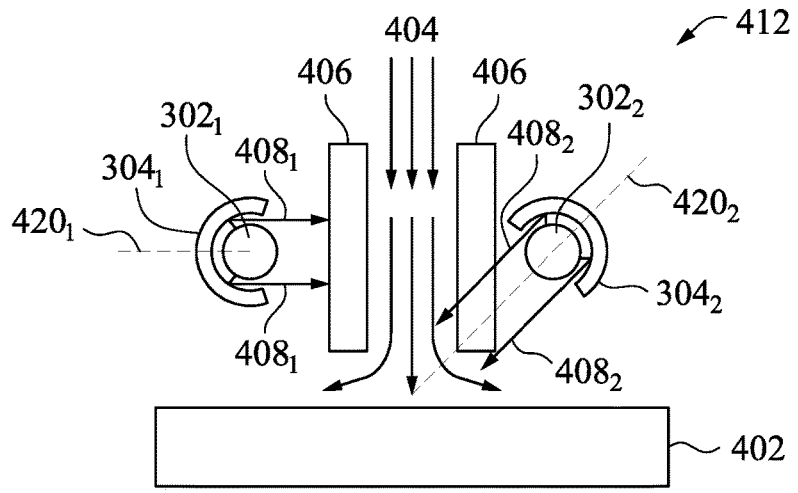
Figure 4C:
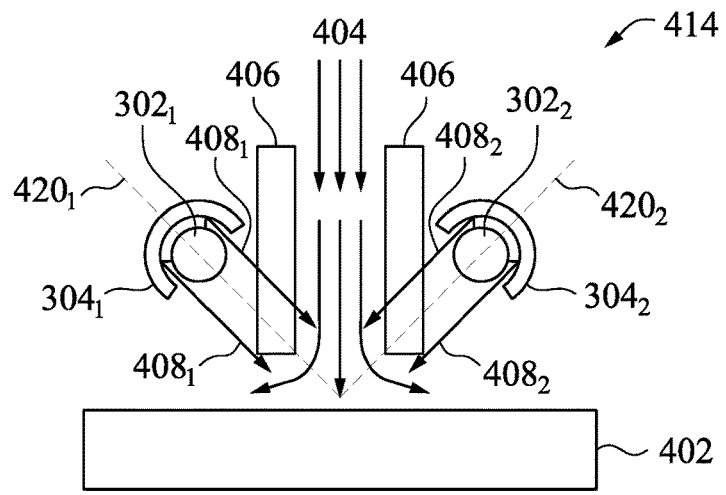

In addition, although a single UV lamp module 202 is illustrated in FIG. 2, any number of UV lamp modules 202 may be deployed in the wafer cleaning module 200. For example, as illustrated in FIGS. 4A-4C and discussed below, the wafer cleaning module 200 may include two UV lamp modules 202 on opposite sides of quartz plates.

In one embodiment, after the wafers in the cassette in the load port 212 are cleaned, the cassette may be removed and the wafers may continue on for further processing. For example, as noted above, the wafers may be cleaned before a lithography process.

Figure 3:
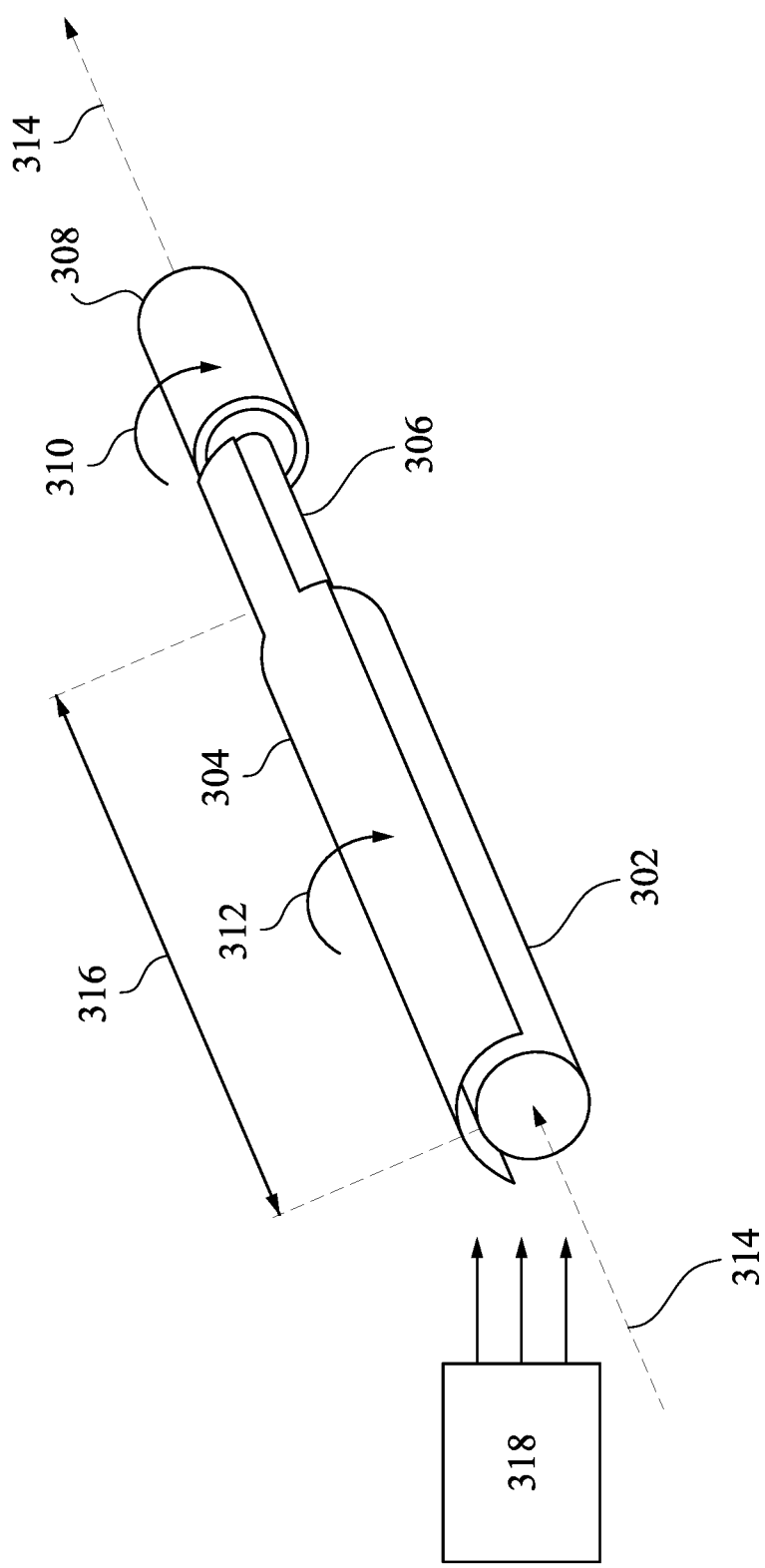
FIG. 3 illustrates a more detailed view of an ultraviolet (UV) lamp module with a rotatable reflector according to at least one embodiment of the present disclosure.

As noted above, the UV lamp module 202 may include a rotatable reflector. FIG. 3 illustrates a more detailed block diagram of one example of the UV lamp module 202 of the present disclosure. In one embodiment, the UV lamp module 202 may include a UV light source 302 and a rotatable reflector 304. In one embodiment, the rotatable reflector 304 may be coupled to a motor 308. The UV light source 302 may be coupled to a non-rotation portion of the motor via an arm 306.

In one embodiment, the UV lamp module 202 may also include an inert gas source 318 to cool the UV light source 302. For example, the inert gas source 318 may be nitrogen ($N_2$) gas. The nitrogen gas may be circulated around the UV light source 302 to prevent the UV light source 302 from overheating during operation.

In one embodiment, the motor 308 may rotate as shown by an arrow 310. Rotation of the motor 308 may cause the rotatable reflector 304 to move or rotate around the UV light source 302 as shown by an arrow 312.

In one embodiment, the rotatable reflector 304 may have a length (e.g., as measured by an arrow 316) that is equal to or longer than a length of the UV light source 302. However, the rotatable reflector 304 may partially cover an outer surface area of the UV light source 302. Said another way, the rotatable reflector 304 may cover an entire length of at least a portion of the outer light emitting surface of the UV light source 302.

In one embodiment, the rotatable reflector 304 may cover half of the outer surface area of the UV light source 302. As a result, the rotatable reflector 304 may be designed to redirect or reflect the light emitted from the UV light source 302 within a relatively collimated beam of light in a desired direction.

In one embodiment, the rotatable reflector 304 may have a cross-sectional curvature that is approximately the same as a cross-sectional curvature of the UV light source 302. For example, the UV light source 302 may have a cylindrical shape. Thus, the cross-section of the UV light source 302 may have a circular shape with a certain amount of curvature. The rotatable reflector 304 may be curved around the circumference of the circular shape to have approximately the same amount of curvature as the circular cross-sectional shape of the UV light source 302.

In one embodiment, the cylindrical shape of the UV light source 302 may have a central axis 314. When the rotatable reflector 304 is moved, the rotatable reflector 304 may be rotated around the central axis 314, as illustrated in FIG. 3.

Although the rotatable reflector 304 is shown in FIG. 3 to have a smooth continuous surface, it should be noted that the rotatable reflector 304 may be deployed with different shapes. For example, the rotatable reflector 304 may have a faceted surface formed from a plurality of rectangular segments. In other words, the cross-sectional shape of the rotatable reflector 304 may appear to be polygonal rather than curved like a semi-circle.

In one embodiment, UV light source 302 may be any type of light source that can provide UV light. In one embodiment, the UV light source 302 may be a mercury (Hg) based lamp. In one embodiment, the rotatable reflector 304 may be fabricated from any reflective material or may be any type of material that is modified to include a reflective surface. For example, the rotatable reflector 304 may be fabricated from silver (Ag), aluminum (Al), and the like.

In one embodiment, the motor 308 may be a stepper motor. Thus, the various positions of the rotatable reflector 304 for different types of materials may be defined by a certain number of steps around the stepper motor. In another embodiment, the rotatable reflector 304 may include physical notches that may rest against a protruding member from the motor 308. Thus, the different positions of the rotatable reflector 304 may be defined by the amount of rotation of the notch between the protruding members. In other words, the motor 308 may rotate the rotatable reflector 304 until the rotation is stopped by contact of a notch against a protruding member.

As noted above, the wafer cleaning module 200 may include the controller 226. The controller 226 may control operation of the motor 308 to rotate the rotatable reflector 304 around the UV light source 302 into a desired position. The position may be determined based on the amount of UV light that is to be directed towards the top surface of the wafer 204. The amount of UV light that is to be directed towards the top surface of the wafer 204 may be determined by a type of material that is deposited on the top surface of the wafer 204 (e.g., a film stack on the wafer 204).

FIGS. 4A-4C illustrate different positions of reflectors $304_1$ and $304_2$ for a wafer cleaning module that includes two UV light sources $302_1$ and $302_2$. It should be noted that at least one of the reflectors $304_1$ or $304_2$ may be rotatable or both may be rotatable. The examples illustrated in FIGS. 4A-4C illustrate an embodiment where both reflectors $304_1$ and $304_2$ are rotatable. FIG. 4A illustrates a position 410 associated with materials that receive little to no surface modification. For example, metals such as Ru may use no surface modification to avoid cracks from forming in the Ru film.

FIG. 4A illustrates quartz plates 406 that are located over a wafer 402. The wafer 402 may include a film stack of a metal or material that is to be cleaned. In one embodiment, an ozone gas 404 may be fed through the quartz plates 406. The quartz plates 406 may control the flow of the ozone gas 404 to be fed in a uniform curtain onto the top surface of the wafer 402.

In the position 410, the rotatable reflector $304_1$ and the rotatable reflector $304_2$ may be positioned such that the UV light emitted by the UV light sources $302_1$ and $302_2$ is directed away from the top surface of the wafer 402. As can be seen by the arrows $408_1$ and $408_2$ that represent the light rays, the light may be emitted directly towards the quartz plates 406. Said another way, the light rays may be reflected to be approximately parallel to the top surface of the wafer 402.

In other words, a central axis of the rotatable reflectors $304_1$ and $304_2$ may be represented by an imaginary straight line that runs through a center of the rotatable reflectors $304_1$ and $304_2$. The central axis is represented by dashed lines $420_1$ and $420_2$ for the rotatable reflectors $304_1$ and $304_2$, respectively. The rotatable reflectors $304_1$ and $304_2$ may be rotated in the position 410 such that the central axes $420_1$ and $420_2$ are both approximately parallel with the top surface of the wafer 402.

FIG. 4B illustrates a position 412 associated with materials that receive a medium surface modification. For example, metals such as Mb or silicon (Si) may receive some surface modification for cleaning without cracking from UV light exposure.

FIG. 4B illustrates a similar wafer cleaning module as illustrated in FIG. 4A. However, the rotatable reflectors $304_1$ and $304_2$ may be positioned to direct some UV light towards the top surface of wafer 402. For example, in the position 412, at least one of the rotatable reflectors $304_1$ and $304_2$ may be directed away from the top surface of the wafer 402 and one of the rotatable reflectors $304_1$ and $304_2$ may be pointed towards the top surface of the wafer 402.

FIG. 4B illustrates an example where the reflector $304_1$ is rotated into a position such that the central axis $420_1$ is approximately parallel with the top surface of the wafer 402. The reflector $304_2$ is positioned such that the central axis $420_2$ is at an angle towards the top surface of the wafer 402. In one embodiment, the angle of the central axis $420_2$ to the top surface of the wafer 402 may be approximately 30 degrees to 50 degrees. In one embodiment, the angle may be approximately 45 degrees.

FIG. 4C illustrates a position 414 associated with materials that receive a strong, or large amount, of surface modification. For example, metals such as Cr or Tantalum (Ta) may receive large amounts of surface modification for cleaning without cracking from UV light exposure.

FIG. 4C illustrates a similar wafer cleaning module as illustrated in FIGS. 4A and 4B. However, the rotatable reflectors $304_1$ and $304_2$ may both be positioned to direct UV light towards the top surface of the wafer 402. For example, in the position 414, both of the reflectors $304_1$ and $304_2$ may be positioned to reflect the UV light towards the top surface of the wafer 402. In one embodiment, the angle of the central axes $420_1$ and $420_2$ may be approximately 30 degrees to 50 degrees. In one embodiment, the angle of the central axes $420_1$ and $420_2$ may be approximately 45 degrees.

Figure 5:
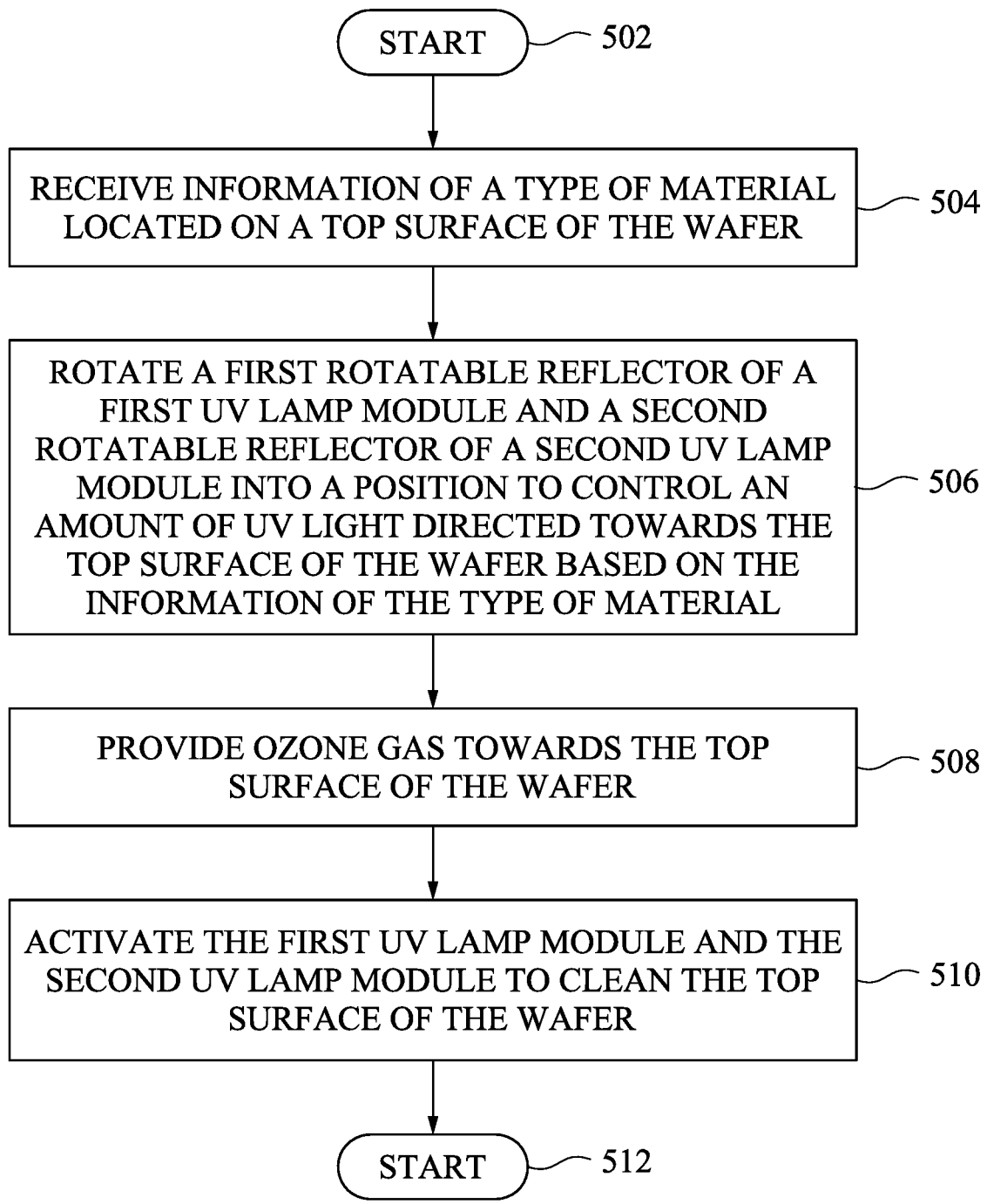
FIG. 5 illustrates a flowchart of a method for processing a wafer in an ozone cleaning module according to at least one embodiment of the present disclosure.

Although a few example positions 410, 412, and 414 are illustrated in FIGS. 4A, 4B, and 4C, it should be noted that other positions of the rotatable reflectors $304_1$ and $304_2$ may be within the scope of the present disclosure. For example, the rotatable reflectors $304_1$ and $304_2$ may be positioned at any angle relative to the top surface of the wafer 402 to control the amount of UV light directed towards or away from the wafer 402. The position of the rotatable reflectors $304_1$ and $304_2$ may be a function of a type of material that is being cleaned on the wafer 402 and the material's sensitivity to UV light exposure. FIG. 5 illustrates a flowchart of a method 500 of cleaning a wafer in a wafer cleaning module having a first ultraviolet (UV) lamp module with a first rotatable reflector and a second UV lamp module with a second rotatable reflector according to at least one embodiment of the present disclosure. The method 500 may be performed via the wafer cleaning module 200 or the wafer cleaning module illustrated in FIGS. 4A-4C.

While the method 500 is illustrated and described below as a series of acts or events, it will be appreciated that the illustrated ordering of such acts or events are not to be interpreted in a limiting sense. For example, some acts may occur in different orders and/or concurrently with other acts or events apparat from those illustrated and/or described herein. In addition, not all illustrated acts may be required to implement one or more aspects or embodiments of the description herein. Further, one or more of the acts depicted herein may be carried out in one or more separate acts and/or phases.

The method 500 begins at block 502. At block 504, the method 500 receives information of a type of material located on a top surface of the wafer. In one embodiment, the information may be received from information contained in a recipe to fabricate an IC device. For example, the recipe may provide information to various tools within a wafer fabrication plant to set various process parameters and control the tools for different steps within the fabrication process. In another embodiment, the information may be entered by a technician via a user interface on the wafer cleaning module.

At block 506, the method 500 rotates the first rotatable reflector and the second rotatable reflector into a position to control an amount of UV light directed towards the top surface of the wafer based on the information of the type of material. For example, different types of materials may have different sensitivity to UV light. Some materials may crack when exposed to UV light. Other materials may be resistant to cracking, but use UV light to modify a surface of the material. The modification may allow the surface to be hydrophilic and easier to clean. For example, materials like Ru may receive little to no amount of UV light. Materials like Mb may receive some UV light. Materials like Cr may receive direct UV light for surface modification. Thus, the positioning of the rotatable reflectors may be a function of a sensitivity of the material to UV light.

In one embodiment, the position of the rotatable reflectors may be to direct UV light away from the top surface of the wafer. For example, the first rotatable reflector and the second rotatable reflector may be positioned such that UV light is reflected in a direction that is approximately parallel to a top surface of the wafer.

In one embodiment, the position of the rotatable reflectors may be to direct some UV light towards the top surface of the wafer. For example, one of the rotatable reflectors may be directed away from the top surface of the wafer and one of the rotatable reflectors may be directed towards the top surface of the wafer. In other words, one of the rotatable reflectors may reflect the UV light to be approximately parallel with the top surface of the wafer and the other rotatable reflector may reflect the UV light at an angle towards the top surface of the wafer.

In one embodiment, the position of the rotatable reflectors may be to direct UV light towards the top surface of the wafer. For example, the first rotatable reflector and the second rotatable reflector may be positioned such that UV light is reflected in a direction that is angled towards a top surface of the wafer.

At block 508, the method 500 provides ozone gas towards the top surface of the wafer. After the first rotatable reflector and the second rotatable reflector are moved, or rotated, into a desired position based on the type of material on the wafer, the ozone gas may be provided. In one embodiment, the ozone gas may be fed between quartz plates. The quartz plates may control the flow of the ozone gas into a uniform curtain onto the wafer.

At block 510, the method 500 activates the first UV lamp module and the second UV lamp module to clean the top surface of the wafer. In one embodiment, the quartz plates may also be optically clear to allow the UV light to be emitted through the quartz glass to decompose the ozone gas into oxygen radicals.

In one embodiment, DI water may also be fed to react with the oxygen radicals to form hydroxide radicals. The oxygen radicals and the hydroxide radicals may oxidize the material on the top surface of the wafer for cleaning.

In one embodiment, the method 500 may be repeated with another wafer that has a different type of material on the wafer. For example, a second wafer having a different type of material on a top surface of the wafer may be loaded into the wafer cleaning module. The material may have a different sensitivity to UV light than the material on the first wafer. As a result, the rotatable reflectors may be moved into a different position to direct an appropriate amount of UV light towards the surface of the second wafer. After the rotatable reflectors are moved to a desired position, the ozone gas can be provided and the UV light may be activated to clean the second wafer.

Thus, the wafers having film stacks of different materials, or metals, may be cleaned within the same wafer cleaning module. The rotatable reflector on the UV light source may be moved or rotated to control the direction and amount of UV light that is directed towards the wafer. At block 512, the method 500 ends.

Therefore, the present disclosure relates to a wafer cleaning module having UV lamp modules with rotatable reflectors. The wafer cleaning module may include a wafer chuck to hold the wafer. An ozone source may provide ozone gas towards the wafer. An ultraviolet (UV) lamp module is included to provide UV light. The UV lamp module comprises a UV light source and a rotatable reflector located around the UV light source. The rotatable reflector is movable to adjust an amount of UV light directed towards a surface of the wafer. For example, the rotatable reflector can be rotated around the UV light source.

In other embodiments, the present disclosure relates to a wafer cleaning module with multiple UV lamp modules with respective rotatable reflectors. The wafer cleaning module may include a wafer chuck to hold a wafer, a first quartz plate and a second quartz plate, a first UV lamp module and a second UV lamp module, and an ozone source. The first quartz plate and the second quartz plate may be located above the wafer. The ozone source may provide ozone gas between the first quartz plate and the second quartz plate towards the wafer. The first UV lamp module may include a first rotatable reflector and be located adjacent to the first quartz plate. The second UV lamp module may include a second rotatable reflector and be located adjacent to the second quartz plate and opposite the first UV lamp module.

In yet other embodiments, the present disclosure relates to a method for cleaning a wafer in an wafer cleaning module having a first ultraviolet (UV) lamp module with a first rotatable reflector and a second UV lamp module with a second rotatable reflector. The method includes receiving information of a type of material located on a top surface of the wafer. Then, based on the information of the type of material on the wafer, the first rotatable reflector and the second rotatable reflector may be rotated into a position to control an amount of UV light directed towards the top surface of the wafer. Ozone gas may be provided towards the top surface of the wafer and the first UV lamp module and the second UV lamp module may be activated to clean the top surface of the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A substrate cleaning module, comprising:
a chuck to hold a substrate;
first and second quartz plates over the chuck and defining a gas passage, wherein the first quartz plate has an inner surface facing the gas passage and an outer surface opposite to the inner surface;
an ozone source to provide ozone gas towards the substrate through the gas passage; and
an ultraviolet (UV) lamp module laterally adjacent the outer surface of the first quartz plate to provide UV light, wherein the UV lamp module, comprises:
a UV light source; and
a rotatable reflector located around the UV light source, wherein the rotatable reflector is movable to adjust an amount of UV light directed towards a surface of the substrate.

2. The substrate cleaning module of claim 1, further comprising:
quartz plates, wherein the ozone gas is provided between the quartz plates in a uniform curtain.

3. The substrate cleaning module of claim 1, wherein the UV lamp module further comprises:
a motor, wherein the rotatable reflector is coupled to the motor and the motor is to rotate the rotatable reflector around the UV light source.

4. The substrate cleaning module of claim 1, wherein the rotatable reflector has a cross-sectional curvature that is substantially similar to a cross-sectional curvature of the UV light source.

5. The substrate cleaning module of claim 1, wherein the rotatable reflector partially covers an outer surface area of the UV light source.

6. The substrate cleaning module of claim 1, wherein the rotatable reflector comprises silver or aluminum oxide.

7. The substrate cleaning module of claim 1, wherein the rotatable reflector is controlled to be positioned at one of a plurality of different pre-defined positions based on a metal on a top layer of the substrate.

8. The substrate cleaning module of claim 1, wherein the UV light source comprises a cylindrical shape having a center axis.

9. The substrate cleaning module of claim 8, wherein the rotatable reflector partially covers the cylindrical shape of the UV light source and rotates around the center axis of the UV light source.

10. A substrate cleaning module, comprising:
a chuck to hold a substrate;
a first quartz plate and a second quartz plate located above the substrate, wherein the first quartz plate and the second quartz plate form a gas passage;
a first ultraviolet (UV) lamp module comprising a first reflector located adjacent to the first quartz plate;
a second UV lamp module comprising a second reflector located adjacent to the second quartz plate and opposite the first UV lamp module, wherein at least one of the first reflector or second reflector is rotatable, and wherein the first UV lamp module and the second UV lamp module are disposed on opposite sides of the gas passage; and
an ozone source to provide ozone gas through the gas passage formed by the first quartz plate and the second quartz plate towards the substrate.

11. The substrate cleaning module of claim 10, wherein the first reflector and the second reflector are positioned to direct UV light emitted by the first UV lamp module and the second UV lamp module away from a top surface of the substrate.

12. The substrate cleaning module of claim 11, wherein the first reflector and the second reflector are positioned such that a central axis of the first reflector and the second reflector are approximately parallel to the top surface of the substrate.

13. The substrate cleaning module of claim 10, wherein at least one of the first reflector and the second reflector is positioned to direct UV light emitted by the first UV lamp module or the second UV lamp module away from a top surface of the substrate and at least one of the first reflector and the second reflector is positioned to direct the UV light emitted by the first UV lamp module or the second UV lamp module towards the top surface of the substrate.

14. The substrate cleaning module of claim 13, wherein at least one of the first reflector and the second reflector is positioned such that a central axis of the first reflector or the second reflector is approximately parallel to the top surface of the substrate and a central axis of the other one of the first reflector or the second reflector is angled at approximately 45 degrees relative to the top surface of the substrate.

15. The substrate cleaning module of claim 10, wherein the first reflector and the second reflector are positioned to direct UV light emitted by the first UV lamp module and the second UV lamp module towards a top surface of the substrate.

16. The substrate cleaning module of claim 15, wherein the first reflector and the second reflector are positioned such that a central axis of the first reflector and the second reflector are angled approximately 45 degrees relative to the top surface of the substrate.

17. A method for cleaning a substrate in a substrate cleaning module having a first ultraviolet (UV) lamp module with a first rotatable reflector and a second UV lamp module with a second rotatable reflector, comprising:
receiving, by a controller, information of a type of material located on a top surface of the substrate;
rotating, by the controller, the first rotatable reflector and the second rotatable reflector into a position to control an amount of UV light directed towards the top surface of the substrate based on the information of the type of material;
providing, by the controller, ozone gas through a gas passage formed by first and second quartz plates to the top surface of the substrate, wherein the first and second UV lamp modules are laterally adjacent the first and second quartz plates, respectively; and
activating, by the controller, the first UV lamp module and the second UV lamp module to clean the top surface of the substrate.

18. The method of claim 17, further comprising:
receiving, by the controller, information of a type of second material located on a top surface of a second substrate;
rotating, by the controller, the first rotatable reflector and the second rotatable reflector into a second position to control the amount of UV light directed towards the top surface of the second substrate based on the information of the type of second material;
providing, by the controller, the ozone gas towards the top surface of the second substrate; and
activating, by the controller, the first UV lamp module and the second UV lamp module to clean the top surface of the second substrate.

19. The method of claim 17, wherein the rotating comprises moving the first rotatable reflector around a central axis of the first UV lamp module and moving the second rotatable reflector around a central axis of the second UV lamp module.

20. The method of claim 17, wherein the position is based on an amount of surface modification desired for the type of material.

* * * * *